United States Patent
Ichihara et al.

(10) Patent No.: US 10,232,803 B2
(45) Date of Patent: Mar. 19, 2019

(54) TEMPORARY PLACEMENT STRUCTURE FOR SUB COVER

(71) Applicants: Hiroaki Ichihara, Aichi-ken (JP); Nobuyoshi Imaeda, Aichi-ken (JP); Shuuichi Satou, Aichi-ken (JP); Masaaki Uechi, Aichi-ken (JP); Hideaki Hayashi, Aichi-ken (JP); Atsutoshi Sakaguchi, Aichi-ken (JP)

(72) Inventors: Hiroaki Ichihara, Kariya (JP); Nobuyoshi Imaeda, Kariya (JP); Shuuichi Satou, Kariya (JP); Masaaki Uechi, Nagoya (JP); Hideaki Hayashi, Toyota (JP); Atsutoshi Sakaguchi, Toyota (JP)

(73) Assignees: Toyota Shatai Kabushiki Kaisha, Aichi-ken (JP); Toyota Jidosha Kabushiki Kaisha, Aichi-ken (JP)

( * ) Notice: Subject to any disclaimer, the term of this patent is extended or adjusted under 35 U.S.C. 154(b) by 38 days.

(21) Appl. No.: 15/513,432

(22) PCT Filed: Sep. 15, 2015

(86) PCT No.: PCT/JP2015/076164
§ 371 (c)(1),
(2) Date: Mar. 22, 2017

(87) PCT Pub. No.: WO2016/063662
PCT Pub. Date: Apr. 28, 2016

(65) Prior Publication Data
US 2017/0320450 A1 Nov. 9, 2017

(30) Foreign Application Priority Data
Oct. 22, 2014 (JP) .................................. 2014-215634

(51) Int. Cl.
*B60R 13/00* (2006.01)
*B60R 13/02* (2006.01)
(Continued)

(52) U.S. Cl.
CPC ............ *B60R 13/0275* (2013.01); *B60R 1/04* (2013.01); *H05K 5/03* (2013.01); *B60N 3/023* (2013.01);
(Continued)

(58) Field of Classification Search
CPC ...... H01R 12/79; H01R 12/88; H01R 12/721; B60S 9/08; Y10T 29/49721;
(Continued)

(56) References Cited

U.S. PATENT DOCUMENTS 7,137,659 B2 * 11/2006 Tiesler ...................... B60R 7/04
296/37.8
7,268,306 B2 * 9/2007 Ikunami .............. B60R 11/0235
200/11 R
(Continued)

FOREIGN PATENT DOCUMENTS

DE 103 57 997 A1 9/2004
JP H05-55155 U 7/1993
(Continued)

OTHER PUBLICATIONS

International Search Report for International Application No. PCT/JP2015/076164 dated Nov. 17, 2015.
(Continued)

*Primary Examiner* — Kiran B Patel
(74) *Attorney, Agent, or Firm* — Patterson Thuente Pedersen, P.A.

(57) ABSTRACT

Groove formation portions that define insertion grooves are located in two opposing inner sides of an opening of a main cover. Engagement shafts are located on side portions of the
(Continued)

sub-cover that oppose the inner sides. The engagement shafts are insertable into the insertion grooves from an outside and have a thickness that is larger than a groove width of the insertion grooves. The groove formation portions are elastic and deformable to allow insertion of the engagement shafts when the engagement shafts are inserted from the outside. The groove formation portions elastically return to their original forms after insertion of the engagement shafts to engage the engagement shafts and restrict separation of the engagement shafts in a reverse direction. The groove formation portions support the sub-cover to allow the sub-cover to open while engaged with the engagement shafts.

7 Claims, 7 Drawing Sheets

(51) Int. Cl.
B60R 1/04 (2006.01)
H05K 5/03 (2006.01)
B60N 3/02 (2006.01)

(52) U.S. Cl.
CPC ....... B60N 3/026 (2013.01); B60R 2013/0287 (2013.01)

(58) Field of Classification Search
CPC ............. H05K 7/1497; H05K 7/20745; H05K 7/20836; H05K 7/20736; G06F 1/20
USPC ...................................................... 296/24.34
See application file for complete search history.

(56) References Cited

U.S. PATENT DOCUMENTS

| 7,722,102 | B2* | 5/2010 | Hansen | B60R 7/04 296/24.34 |
| 8,387,992 | B2* | 3/2013 | Tanida | F16J 15/326 123/197.1 |
| 8,444,199 | B2* | 5/2013 | Takeuchi | B60N 3/10 296/24.34 |
| 8,474,214 | B2* | 7/2013 | Dawe | F16B 5/0664 24/289 |
| 9,211,845 | B2* | 12/2015 | Yano | B60R 7/04 |
| 9,586,535 | B2* | 3/2017 | Dalton | B60R 13/0256 |
| 9,925,927 | B2* | 3/2018 | Ogawa | B60R 7/04 |
| 2004/0169390 | A1 | 9/2004 | Tiesler et al. | |
| 2006/0061119 | A1 | 3/2006 | Tiesler et al. | |
| 2013/0062899 | A1* | 3/2013 | Stoia | B60N 2/773 296/24.34 |
| 2015/0130206 | A1* | 5/2015 | Schneider | B60R 7/04 296/24.34 |
| 2016/0229355 | A1* | 8/2016 | Hayashi | B60R 11/04 |

FOREIGN PATENT DOCUMENTS

| JP | H07-026995 U | 5/1995 |
| JP | H09-246744 A | 9/1997 |
| JP | 10-278683 | 10/1998 |
| JP | 2005-186903 A | 7/2005 |
| JP | 2005225459 | 8/2005 |
| JP | 2006103523 | 4/2006 |
| JP | 2010129836 | 6/2010 |

OTHER PUBLICATIONS

IPRP for International Application No. PCT/JP2015/076164 dated Oct. 18, 2016.
Notification of Reasons for Refusal for JP Patent Application No. 2014-215634, dated Nov. 20, 2017, (1-2 Japanese, 3-5 English Translation) 5 pages total.
German Office Action for Application No. 11 2015 004 838.3 dated Aug. 14, 2018 (5 pgs.).

* cited by examiner

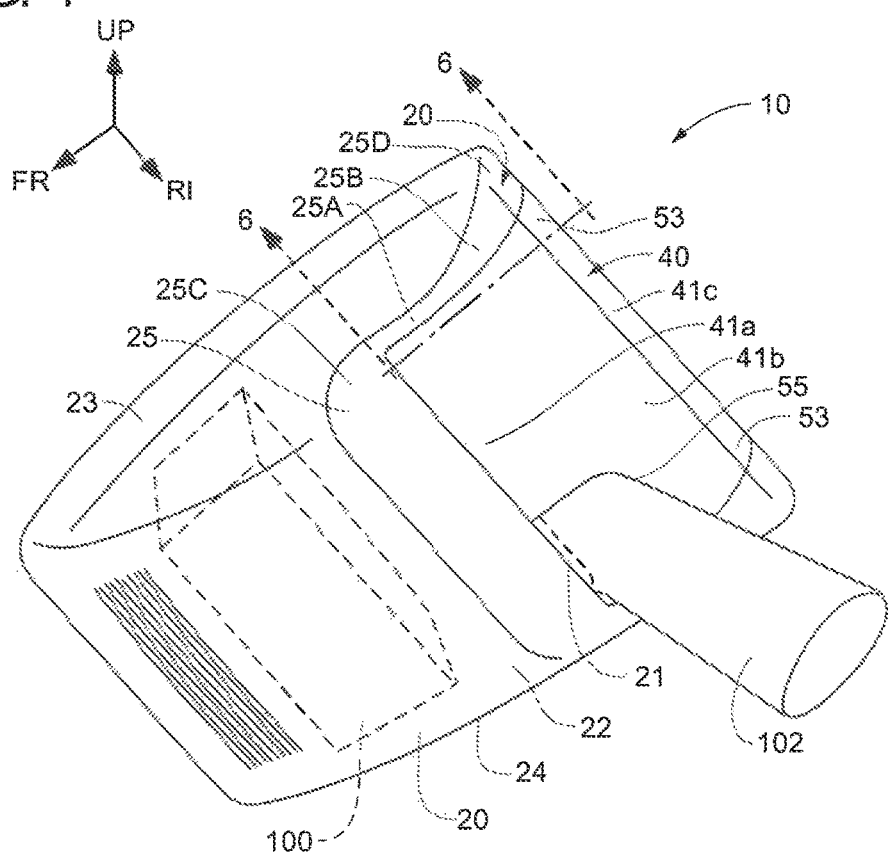

TEMPORARY PLACEMENT STRUCTURE FOR SUB COVER

RELATED APPLICATIONS

The present application is a National Phase entry of PCT Application No. PCT/JP2015/076164, filed Sep. 15, 2015, which claims priority to JP 2014-215634 filed Oct. 22, 2014, all said applications being hereby incorporated herein by reference in their entireties.

BACKGROUND OF THE INVENTION

The present invention relates to a structure for temporarily holding a sub-cover on a cover body including a main cover and the sub-cover.

Patent documents 1 and 2 each disclose a technique for coupling a sub-cover to a main cover. Patent document 1 describes a cover coupling structure including a main cover that is fixed to a windshield glass of a vehicle. The main cover covers various sensors, such as a rain sensor, and a rearview mirror coupling portion that are coupled to the windshield glass. The main cover includes a mirror coupling opening used to couple the rearview mirror coupling portion to the windshield glass.

After the rearview mirror coupling portion is coupled to the windshield glass, a sub-cover is coupled to the main cover. The sub-cover closes the mirror coupling opening. The rearview mirror includes a stay that is inserted into a hole of the sub-cover. Patent document 1 does not include any description for temporarily holding the sub-cover on the main cover.

Patent document 2 describes a cover coupling structure in which a cover covering an electronic device includes a main cover coupled to a chassis and a sub-cover coupled to the main cover. The main cover and the sub-cover are formed from a synthetic resin. The electronic device is mounted on the chassis. The main cover includes an open portion where various tasks are performed on the electronic device.

The sub-cover includes two arms that integrally project from the sub-cover. The sub-cover is pivotally supported by the main cover by a screw extending through each arm. This allows the sub-cover to be pivoted in order to open and close the open portion of the main cover. The sub-cover is configured to be adjusted to a firmly fixed state that restricts opening and closing of the sub-cover and a temporarily fixed state that enables opening and closing of the sub-cover in accordance with the tightened degree of the screws.

When the open portion of the main cover is closed by the sub-cover, a projection on an abutment portion of the main cover is fitted to a first groove of a contact portion in each arm. This holds the sub-cover in a temporarily fixed state. When the screws are tightened in this state, the sub-cover is firmly fixed. When the sub-cover closes the open portion of the main cover and the sub-cover is then opened in the temporarily fixed state, the projection of the abutment portion of the main cover is fitted to a second groove, which differs from the first groove, of the contact portion of each arm. This temporarily fixes the sub-cover with the open portion of the main cover in an open state. In this manner, the sub-cover of patent document 2 keeps the open portion of the main cover open or closed in the temporarily fixed state without tightening the screws.

PRIOR ART DOCUMENT

Patent Documents

Patent Document 1: Japanese Laid-Open Patent Publication No. 2005-225459

Patent Document 2: Japanese Laid-Open Patent Publication No. 2010-129836

SUMMARY OF THE INVENTION

The cover coupling structure of patent document 1 requires a worker to temporarily hold the sub-cover at a predetermined temporary holding space before coupling the sub-cover to the main cover. In addition to a separate space for temporarily holding the sub-cover, the device of patent document 1 needs the sub-cover to be moved from the temporary holding space to the main cover. This lowers the efficiency for coupling the sub-cover.

In patent document 2, the sub-cover may be held in a temporarily fixed state when open. However, patent document 2 requires screws and a screw tightening tool such as a screwdriver to tighten the sub-cover to the main cover.

It is an object of the present invention to provide a sub-cover coupling structure that eliminates the need for a tightening tool for a sub-cover while reducing the number of components, eliminates the need for a large temporary holding space for the sub-cover, and ensures sufficient space for the fingers of a worker when coupling the sub-cover.

To solve the above problem, the present invention provides a temporary holding structure for a sub-cover on a cover body in which the cover body includes a main cover, which includes an opening and a first engagement portion located on a rim of the opening, and the sub-cover, which includes a second engagement portion engaged with the first engagement portion when the sub-cover closes the opening to keep the opening closed. The temporary holding structure includes a groove formation portion and two coaxially arranged engagement shafts. The groove formation portion defines an insertion groove. The groove formation portion is located in each of two opposing inner sides of the opening. The engagement shafts are respectively located on two side portions of the sub-cover that oppose the two inner sides. The engagement shafts are insertable into the insertion grooves from an outside and have a thickness that is larger than a groove width of the insertion grooves. The groove formation portions are elastic and deformable to allow insertion of the engagement shafts when the engagement shafts are inserted from the outside. The groove formation portions elastically return to their original forms after insertion of the engagement shafts to engage the engagement shafts and restrict separation of the engagement shafts in a reverse direction. The groove formation portions support the sub-cover to allow the sub-cover to open while engaged with the engagement shafts. The main cover covers an electronic device fixed to a windshield glass.

It is preferred that the sub-cover includes a recess that exposes a stay of a rearview mirror to an outside of the cover body.

It is preferred that the engagement shafts each include a cutout surface that facilitates upward movement of the engagement shaft out of the corresponding insertion groove.

It is preferred that the sub-cover includes a surface that is flush with a surface of the main cover when closing the opening.

It is preferred that the engagement shafts each have a cross-sectional shape that is set so that an engagement amount of the engagement shaft in a state in which the engagement shaft is engaged with the corresponding groove formation portion is larger when an open amount of the opening is large than when the open amount is small.

It is preferred that the groove formation portions each include a guide that guides the corresponding engagement shaft toward the corresponding insertion groove when the engagement shaft is inserted into the insertion groove from the outside.

It is preferred that the sub-cover includes a stopper that restricts increases in an open amount of the opening when the engagement shafts are engaged with the groove formation portions.

The present invention eliminates the need for a tightening tool for a sub-cover while reducing the number of components, eliminates the need for a large temporary holding space for the sub-cover, and ensures sufficient space for the fingers of a worker when coupling the sub-cover.

BRIEF DESCRIPTION OF THE DRAWINGS

FIG. 1 is a perspective view showing one embodiment of a cover body.

DETAILED DESCRIPTION OF THE PREFERRED EMBODIMENTS

Figure 2A:
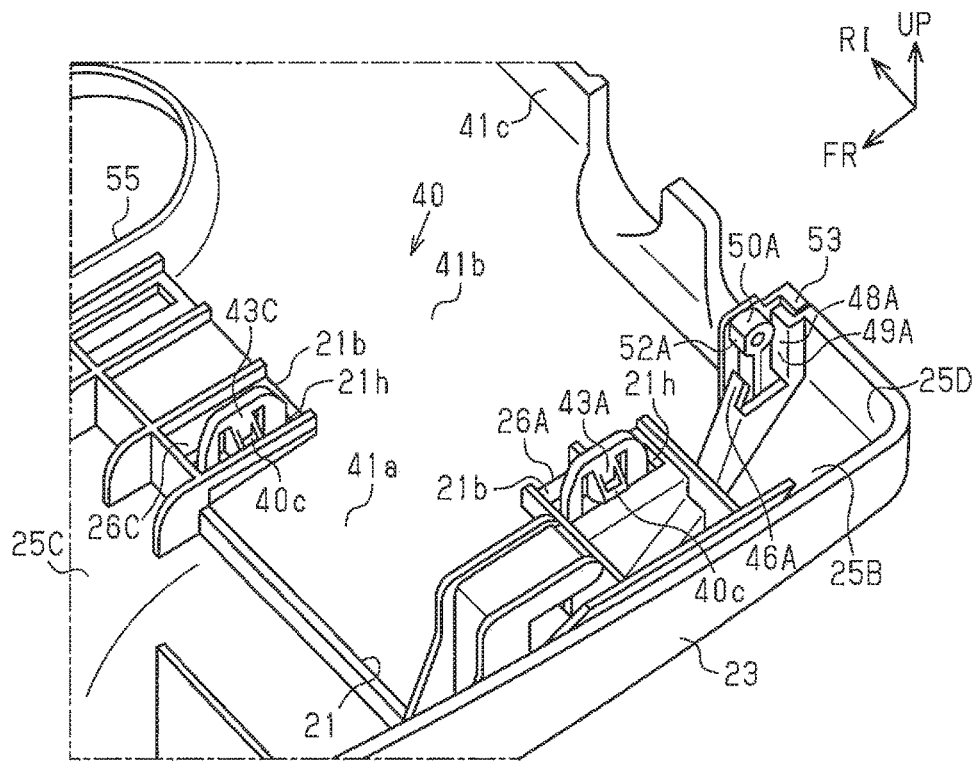
FIGS. 2A and 2B are perspective views each showing a sub-cover that closes an opening of a main cover and is coupled and fixed as viewed in two different directions.

A sub-cover temporary holding structure according to one embodiment of the present invention will now be described with reference to FIGS. 1 to 9. In the drawings, the arrow FR indicates the front side of a vehicle, the arrow UP indicates the upper side of the vehicle, and the arrow RI indicates the right direction that is a lateral direction of the vehicle.

As shown in FIGS. 1 and 7, a cover body 10 is coupled and fixed to a windshield glass (not shown) and includes a main cover 20 and a sub-cover 40 that closes an opening 21 of the main cover 20.

As shown in FIG. 1, the main cover 20, which is formed from a synthetic resin, includes a bottom wall 22 having a curved surface directed toward the lower side and the front of the vehicle. The main cover 20 includes a left side wall 23, a right side wall 24, and a rear side wall 25 that project from the surrounding of the bottom wall 22. The left side wall 23, the right side wall 24, and the rear side wall 25 each include a distal end that is fixed to the windshield glass (not shown) in contact with the windshield glass.

Further, as shown in FIG. 1, the rear side wall 25 includes a step 25A extending downwardly, a curved portion 25B extending from the step 25A toward the rear of the vehicle and curved diagonally upward, an upper rear surface wall 25D extending from the curved portion 25B toward the vertically upper side, and a lower rear surface wall 25C substantially extending from a front edge of the step 25A toward the vertically lower side. Curved connecting portions connect the lower rear surface wall 25C to the step 25A and the curved portion 25B to the upper rear surface wall 25D. The lower rear surface wall 25C is connected integrally to the bottom wall 22. In this manner, the main cover 20 is substantially box-shaped.

Referring to FIGS. 1 and 7, the opening 21 is formed by cutting out the step 25A, the curved portion 25B, and the upper rear surface wall 25D at the side located toward the rear of the vehicle (side opposite to direction of arrow FR), which is the side opposite to the windshield glass (not shown) of the vehicle. The opening 21 is U-shaped in a plan view.

An electronic device 100 such as a rain sensor or a GPS sensor fixed to the windshield glass (not shown) is arranged between the main cover 20 and the windshield glass. The main cover 20 covers the electronic device from below.

Figure 2B:
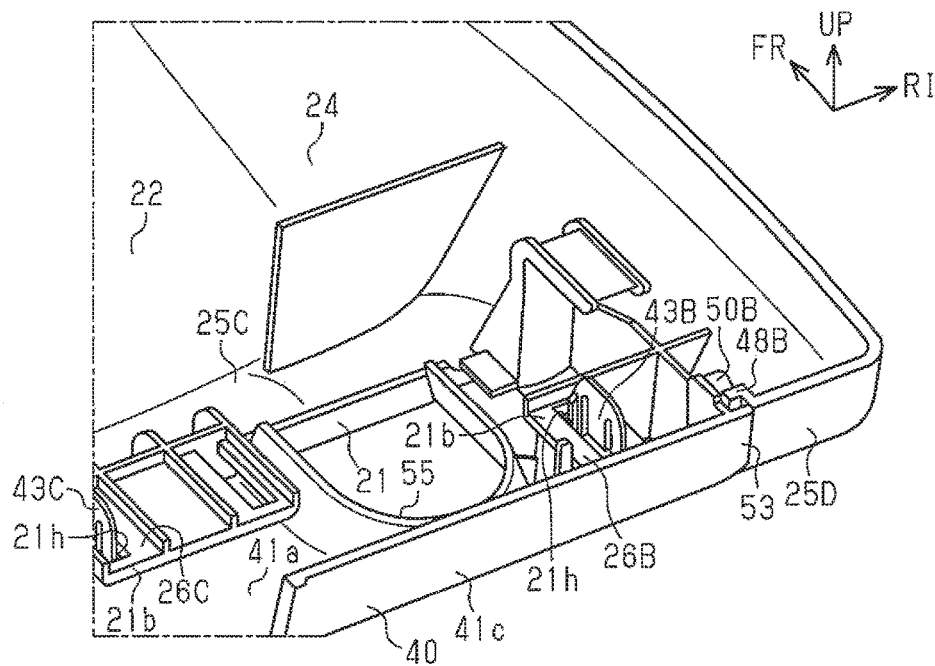

As shown in FIGS. 2A and 2B, three plates 21b project into the opening 21 from the inner surface of the curved portion 25B at the left and right sides of the opening 21 and the inner surface of the lower rear surface wall 25C at the middle portion of the edge of the opening 21 with respect to the lateral direction of the vehicle. The three plates 21b respectively include three fitting portions 26A, 26B, and 26C serving as first engagement portions. The present embodiment is not limited to the three fitting portions 26A, 26B, and 26C and may include any number of fitting portions that allows the sub-cover 40 to be stably coupled and held. The first, second, and third fitting portions 26A, 26B, and 26C each include a distal end located in the opening 21 and an engagement hole 21h extending therethrough in the vertical direction.

The sub-cover 40, which is formed from a synthetic resin, is sized to close the opening 21. When the sub-cover 40, which is coupled and fixed to the main cover 20, is closed, the surface of the sub-cover 40 is flush with the surface (lower surface) of the step 25A, the surface (lower surface) of the curved portion 25B, and the surface of the upper rear surface wall 25D. More specifically, in a state in which the sub-cover 40 is closed, the sub-cover 40 includes a first wall 41a with a surface that is flush with the surface of the step 25A, a second wall 41b with a surface that is flush with the surface of the curved portion 25B, and a third wall 41c with a surface that is flush with the surface of the upper rear surface wall 25D.

Figure 3:
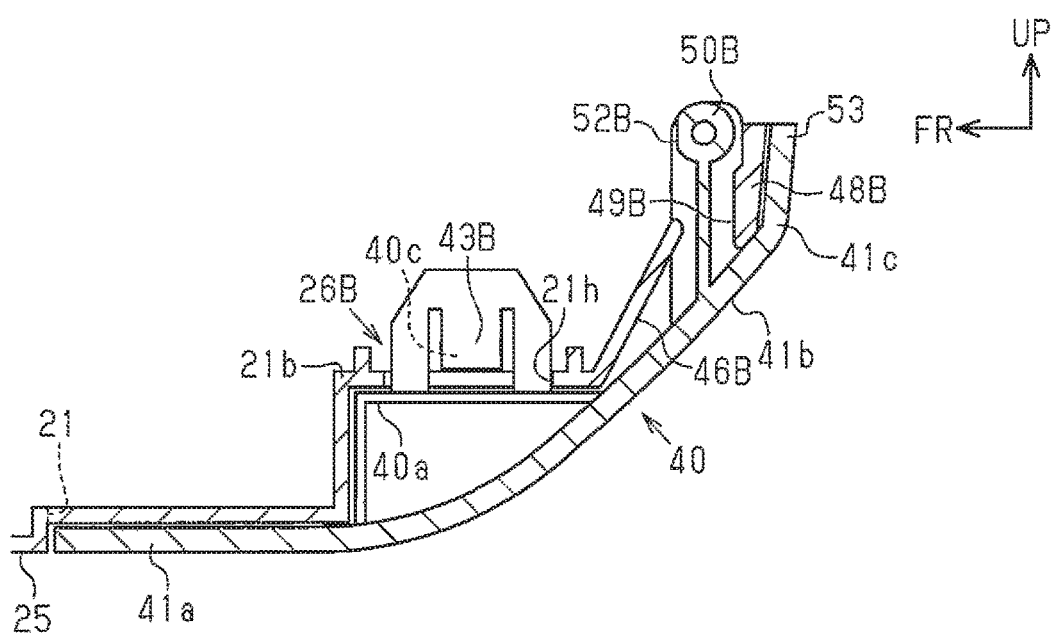
FIG. 3 is a cross-sectional view showing a state in which the sub-cover that closes the opening of the main cover is coupled and fixed.

As shown in FIGS. 2A, 2B, and 3, the upper surface (i.e., back surface) of the second wall 41b of the sub-cover 40 includes a first snap-fit 43A and a second snap-fit 43B projecting upwardly from bases 40a (refer to FIG. 3), which are arranged at the left and right edges with respect to the lateral direction of the vehicle. FIG. 3 shows only the base 40a of the second snap-fit 43B and does not show the base of the first snap-fit 43A.

Figure 7A:
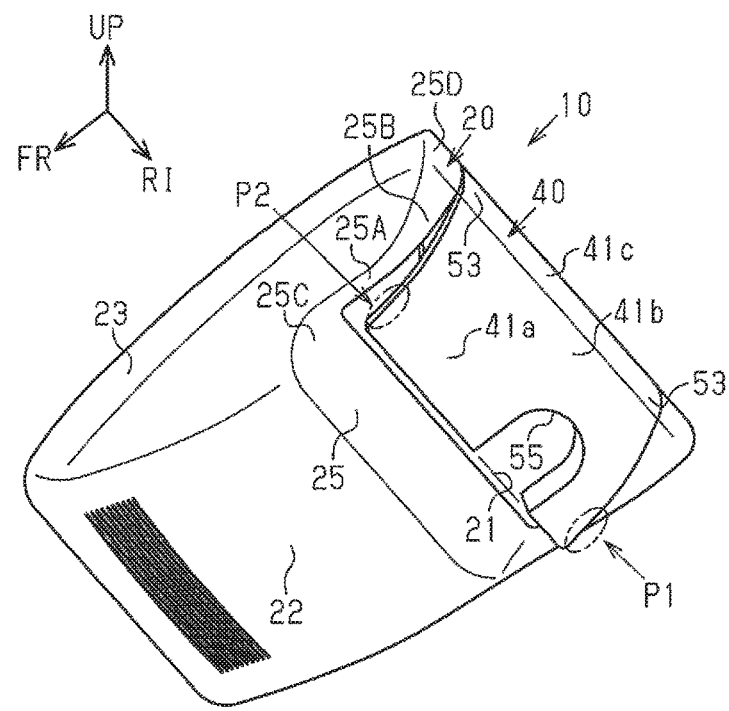
FIG. 7A is a perspective view showing the sub-cover that is temporarily held on the main cover.
Figure 7B:
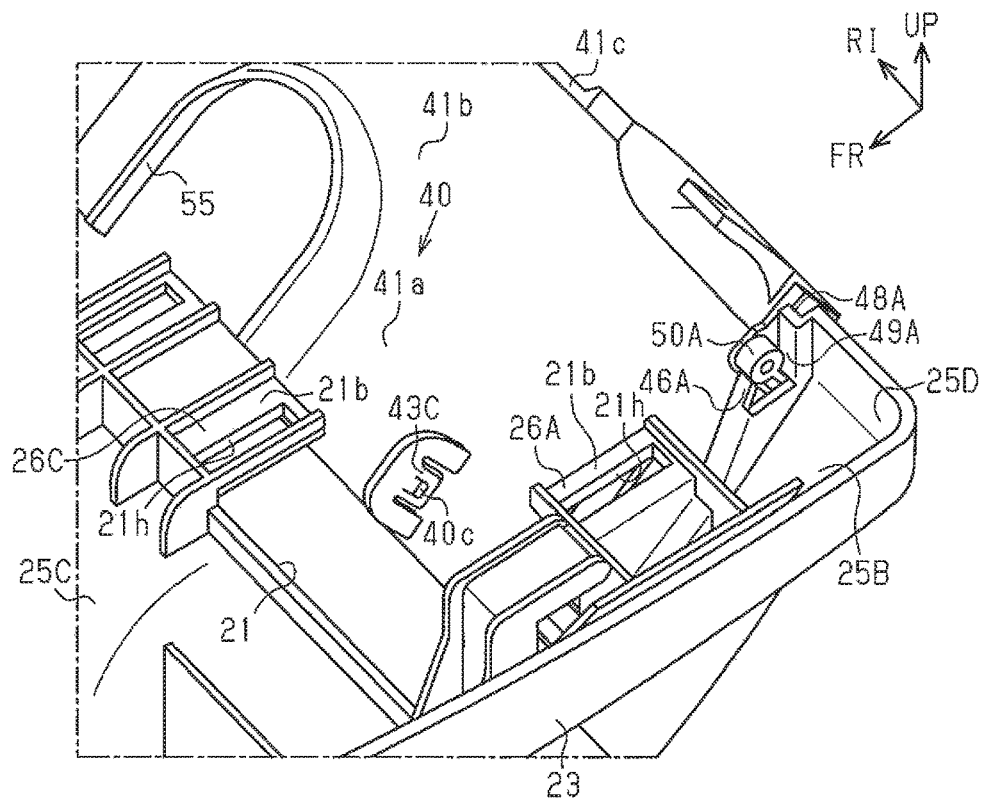
FIG. 7B is a perspective view showing the sub-cover that is temporarily held on the main cover.

As shown in FIGS. 2A, 2B, and 7B, the upper surface (i.e., back surface) of the first wall 41a of the sub-cover 40 includes a third snap-fit 43C projecting upwardly from the middle portion of the front edge with respect to the lateral direction of the vehicle. The first to third snap-fits 43A, 43B, and 43C each include a catch 40c. Each catch 40c is inserted into the engagement hole 21h of the corresponding one of the first to third fitting portions 26A to 26C and engaged with a rim of the engagement hole 21h.

When each catch 40c of the snap-fits 43A, 43B, and 43C is engaged with the rim of corresponding engagement hole 21h of the fitting portions 26A, 26B, and 26C, the bases 40a and part of the upper surface of the sub-cover 40, from which the snap-fits 43A, 43B, and 43C project, abut against the plate 21b of each of the fitting portions 26A, 26B, and 26C. This keeps the catches 40c engaged. FIG. 3 shows the base 40a that abuts against the plate 21b of the second fitting portion 26B. To facilitate understanding, the plate 21b is slightly separated from the upper surface of the base 40a in FIG. 3. However, it should be understood that the plate 21b is in contact with the upper surface of the base 40a. Although not clearly illustrated in FIG. 3, it should be understood that the catch 40c of the second snap-fit 43B is located on the back surface of the second snap-fit 43B and engaged with the rim of the engagement hole 21h.

When the snap-fits 43A, 43B, and 43C are respectively held engaged with the fitting portions 26A, 26B, and 26C as described above, the sub-cover 40 keeps the opening 21 of the main cover 20 closed. Each of the snap-fits 43A, 43B, and 43C corresponds to a second engagement portion.

Figure 4A:
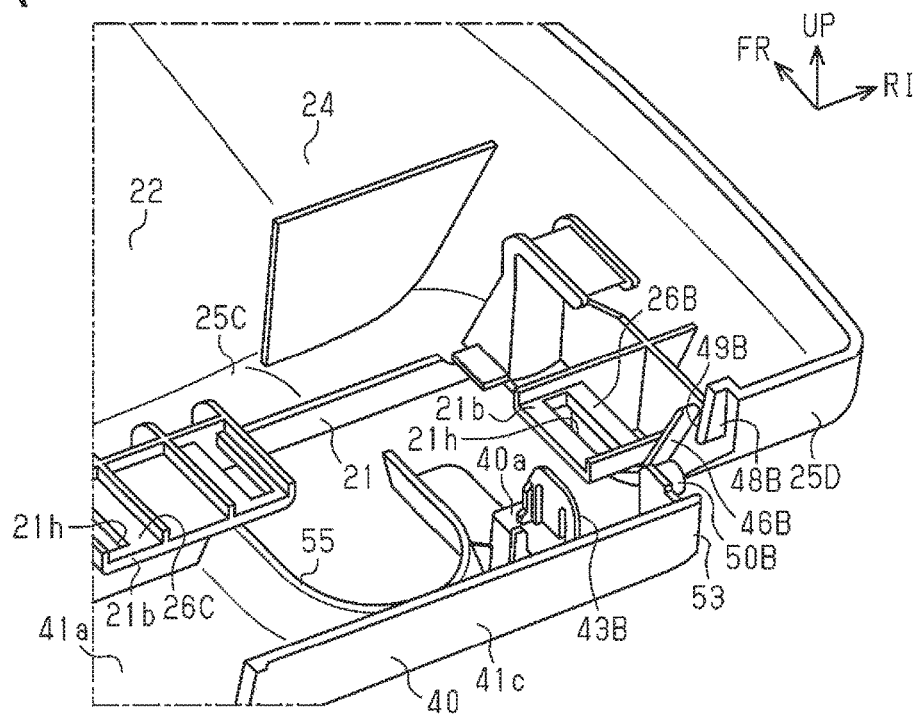
FIG. 4A is a perspective view showing an engagement shaft that is guided when the sub-cover is temporarily held on the main cover.

As shown in FIGS. 2A, 4A, and 7B, the upper rear surface wall 25D of the main cover 20 includes a first step 48A and a second step 48B extending in the vertical direction from the left and right edges that oppose the opening 21 with respect to the lateral direction of the vehicle. The rear surface of each of the first step 48A and the second step 48B is located at the front of the vehicle of the rear surface of the upper rear surface wall 25D.

As shown in FIGS. 2A, 4A, and 7B, the front surface (rear surface) of the curved portion 25B includes a first guide rib 46A and a second guide rib 46B and portions supporting the two guide ribs 46A and 46B formed at the left and right edges that oppose the opening 21 with respect to the lateral direction of the vehicle. Each of the guide ribs 46A and 46B corresponds to a guide that guides each of engagement shafts 50A and 50B (described later). The left and right edges that oppose the opening 21 with respect to the lateral direction of the vehicle correspond to two opposing inner sides of the opening 21. As shown in FIGS. 3, 4A, and 7B, each of the guide ribs 46A and 46B is inclined toward the diagonally rear upper side from a portion separated diagonally downward from each of the steps 48A and 48B, and the upper end of each of the guide ribs 46A and 46B is separated from each of the steps 48A and 48B.

Figure 4B:
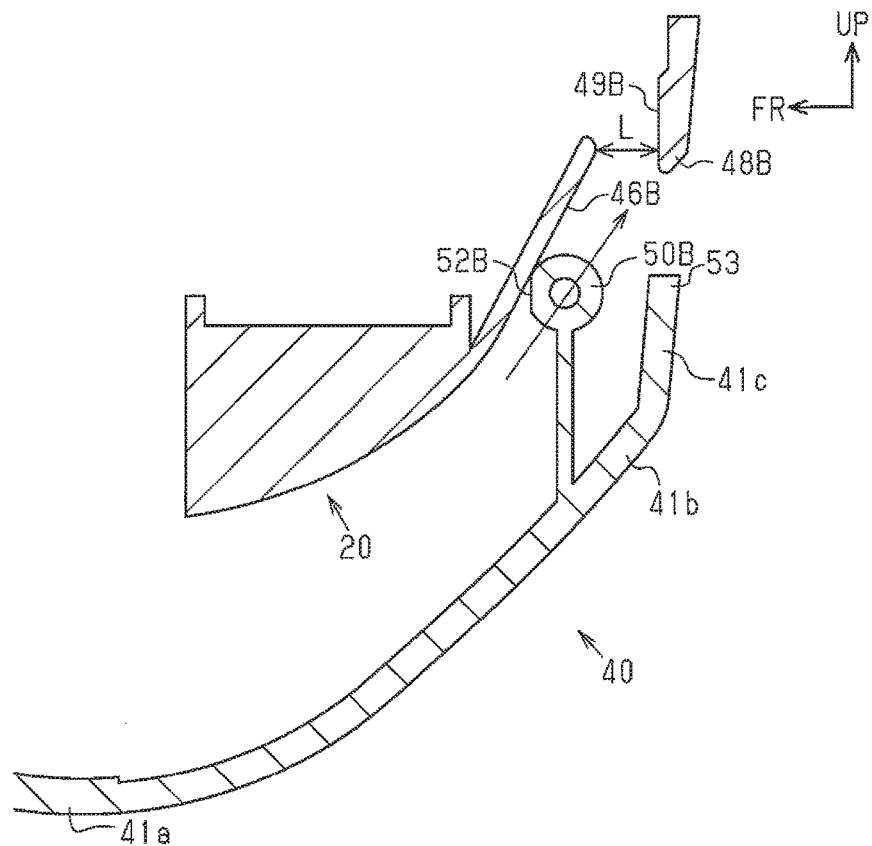
FIG. 4B is a cross-sectional view showing the engagement shaft that is guided when the sub-cover is temporarily held on the main cover.
Figure 5:
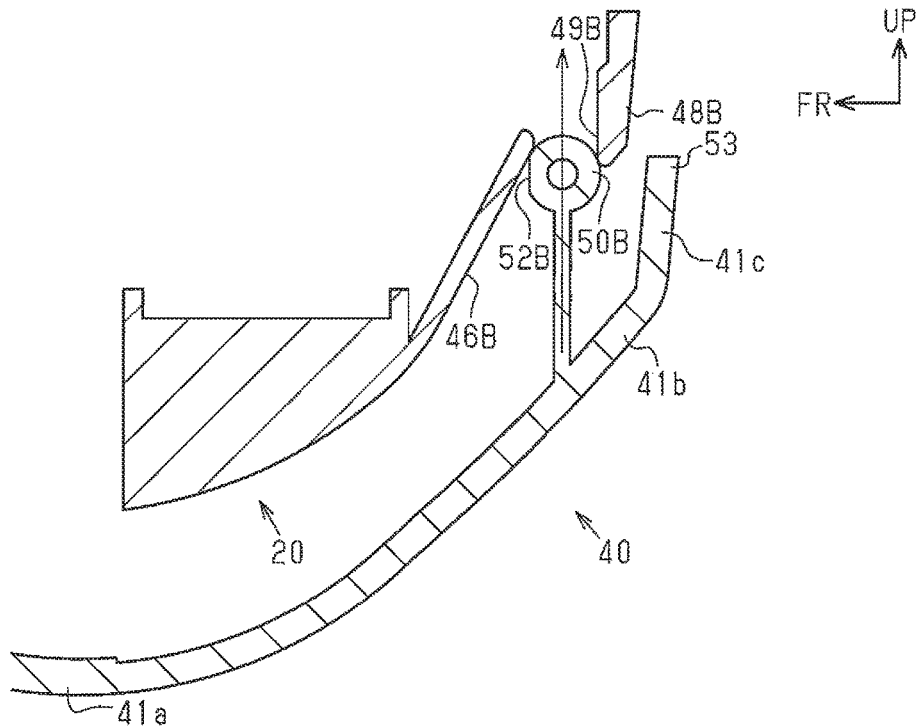
FIG. 5 is a cross-sectional view showing the engagement shaft of the sub-cover immediately before insertion into an insertion groove.

As shown in FIGS. 2A and 4B, a first insertion groove 49A extends between the upper end of the first guide rib 46A and the first step 48A, and a second insertion groove 49B extends between the upper end of the second guide rib 46B and the second step 48B. Each of the insertion grooves 49A and 49B gradually narrows from the lower side to the upper side in the front-rear direction of the vehicle. The groove width from the upper end of each of the guide ribs 46A and 46B to the corresponding one of the steps 48A and 48B is the minimum separation distance L (refer to FIG. 4B).

The upper end of the first guide rib 46A and the first step 48A and the upper end of the second guide rib 46B and the second step 48B correspond to groove formation portions that respectively define the first insertion groove 49A and the second insertion groove 49B.

As shown in FIGS. 2A, 4A, and 7B, the upper surface of the second wall 41b opposing the curved portion 25B includes the first engagement shaft 50A and the second engagement shaft 50B and portions supporting the engagement shafts 50A and 50B formed at the left and right sides of the sub-cover 40 in the lateral direction of the vehicle. The first engagement shaft 50A and the second engagement shaft 50B are tubular and coaxially arranged in the lateral direction of the vehicle.

As shown in FIGS. 2A, 4A, and 7B, the portions of the circumferential surfaces of the first and second engagement shafts 50A and 50B located toward the front of the vehicle are cut out to form flat first and second cutout surfaces 52A and 52B. The first cutout surface 52A and the second cutout surface 52B are arranged to minimize the thickness of the first and second engagement shafts 50A and 50B and reduce sliding resistance in the insertion grooves 49A and 49B when the first and second engagement shafts 50A and 50B are inserted from the outside into the first and second insertion grooves 49A and 49B with the lower surface (surface) of the first wall 41a held parallel to the lower surface (surface) of the step 25A. The thickness of the first and second engagement shafts 50A and 50B corresponds to the length from the first and second cutout surfaces 52A and 52B to the rear surfaces separated from the first and second cutout surfaces 52A and 52B by 180°. Further, the thickness of the first and second engagement shafts 50A and 50B is set to be slightly larger than the minimum separation distance L (refer to FIG. 4B) between the upper ends of the guide ribs 46A and 46B and the steps 48A and 48B.

The first and second guide ribs 46A and 46B and the first and second steps 48A and 48B are elastically deformable. The first and second engagement shafts 50A and 50B are abut against the first and second guide ribs 46A and 46B and the first and second steps 48A and 48B. Then, as the first and second engagement shafts 50A and 50B upwardly press the first and second guide ribs 46A and 46B and the first and second steps 48A and 48B, the first and second guide ribs 46A and 46B and the first and second steps 48A and 48B are elastically deformed. This allows the first and second engagement shafts 50A and 50B to move out of the first and second insertion grooves 49A and 49B and proceed further upward. The first and second cutout surfaces 52A and 52B decrease the amount of elastic deformation of each of the guide ribs 46A and 46B and each of the steps 48A and 48B as compared to when the first and second cutout surfaces 52A and 52B are not provided. This facilitates upward movement of the engagement shafts 50A and 50B from the insertion grooves 49A and 49B.

Figure 6:
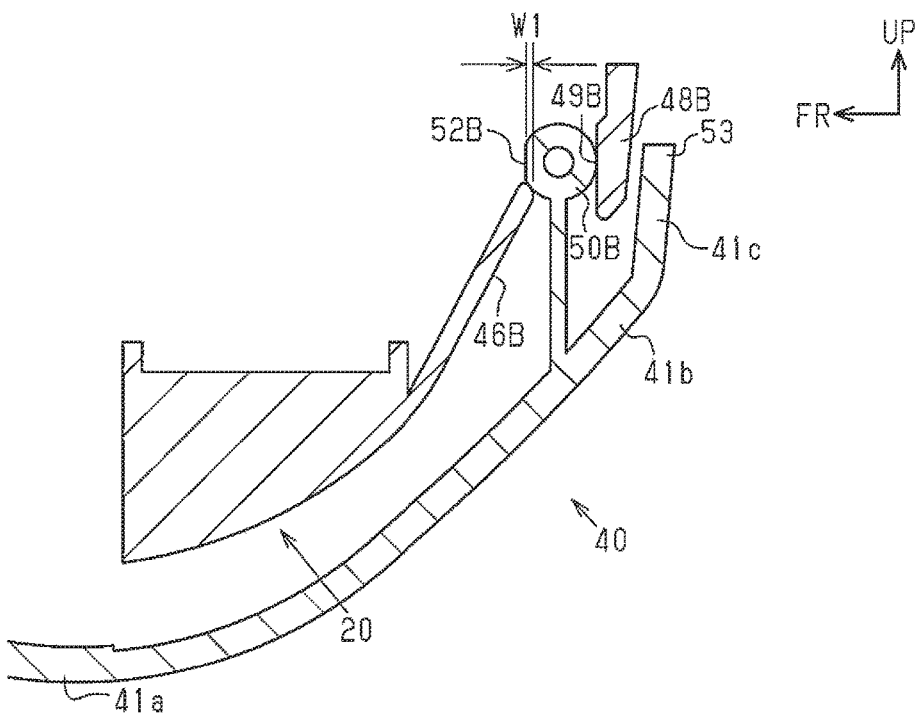
FIG. 6 is a cross-sectional view taken at section 6-6 of FIG. 1 showing the engagement shaft of the sub-cover immediately after insertion into the insertion groove.

As shown in FIG. 6, when the engagement shafts 50A and 50B upwardly move out of the insertion grooves 49A and 49B without pivoting the sub-cover 40, the engagement shafts 50A and 50B at the portions closer to the cutout surfaces 52A and 52B are engaged with the upper ends of the guide ribs 46A and 46B. The engagement amount of the engagement shafts 50A and 50B with the upper ends of the guide ribs 46A and 46B is represented by W1 (refer to FIG. 6).

Figure 8:
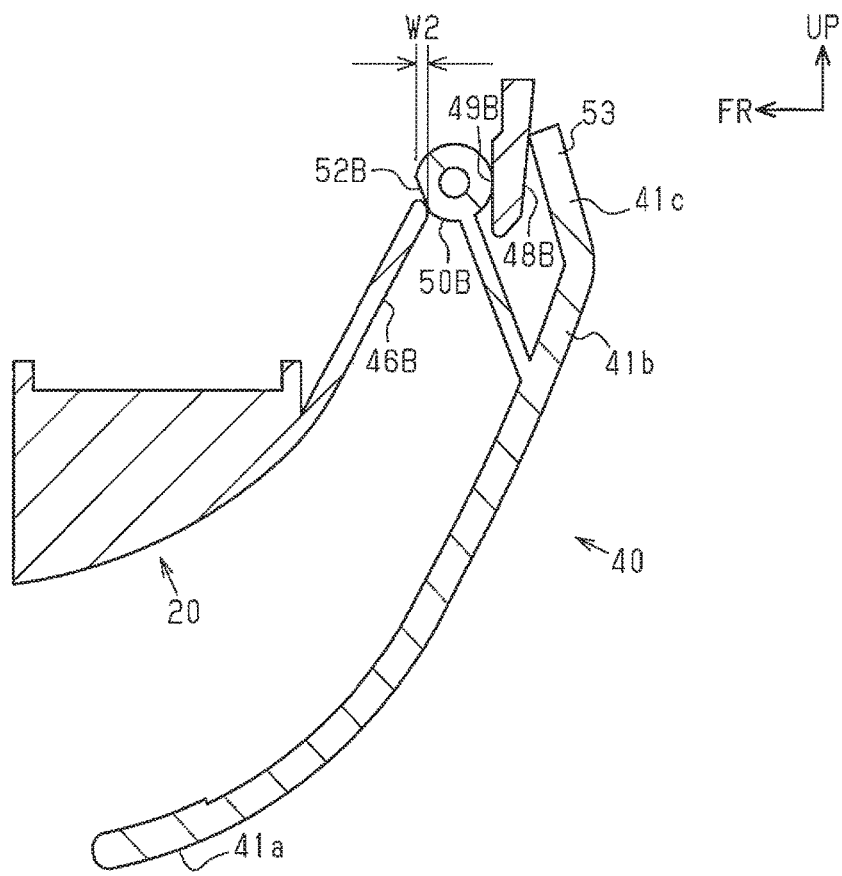
FIG. 8 is a cross-sectional view showing the operation of a stopper of the sub-cover.
Figure 9:
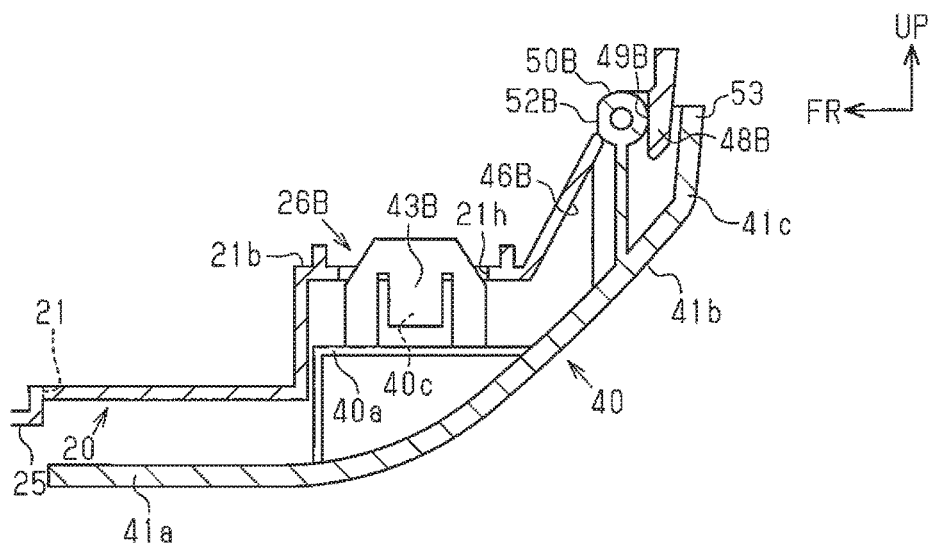
FIG. 9 is a cross-sectional view showing the engagement shaft of the sub-cover immediately after insertion into the insertion groove.

As shown in FIG. 8, when the engagement shafts 50A and 50B are engaged with the upper ends of the guide ribs 46A and 46B and the steps 48A and 48B, the sub-cover 40 is supported to be pivotal toward the rear of the vehicle. As shown in FIGS. 1 and 7A, two stoppers 53 are arranged at the left and right ends of the third wall 41c of the sub-cover 40 in the lateral direction of the vehicle. As shown in FIG. 8, when the sub-cover 40 is pivoted toward the rear of the vehicle, the stoppers 53 abut against the steps 48A and 48B and restrict the pivot amount of the sub-cover 40.

When the sub-cover 40 is temporarily held, the stoppers 53 restrict the open amount (i.e., open angle) of the sub-cover 40 so that the sub-cover 40 does not open more than necessary. The open amount refers to the separation amount by which the front of the sub-cover 40 is separated from the opening 21 when the sub-cover 40 is temporarily held. The separation amount corresponds to the amount allowing a worker to hold opposite side portions P1 and P2 (refer to FIG. 7A) of the sub-cover 40 with the hands.

In the present embodiment, the open amount (i.e., open angle) of the sub-cover 40 relative to the opening 21 increases as the amount in which the sub-cover 40 is pivoted toward the rear of the vehicle increases.

The open angle of the sub-cover 40 will now be described in more detail. As shown in FIG. 6, the open angle of the sub-cover 40 is 0° when the engagement shafts 50A and 50B are engaged with the upper ends of the guide ribs 46A and 46B and the steps 48A and 48B with the first wall 41*a* of the sub-cover 40 parallel to the step 25A. The open angle corresponds to the pivot angle when the sub-cover 40 is pivoted or swung about the engagement shafts 50A and 50B toward the rear of the vehicle.

In the state shown in FIG. 8, the engagement amount of each of the engagement shafts 50A and 50B with the upper end of each of the guide ribs 46A and 46B is represented by W2. The state shown in FIG. 8 differs from the state shown in FIG. 6 in that the engagement amount W2 is greater than the engagement amount W1. This is because the engagement amount increases as the pivoting of the sub-cover 40 toward the rear of the vehicle inclines and moves the cutouts 52A and 52B toward the upper ends of the guide ribs 46A and 46B. An increase in the engagement amount restricts separation of the sub-cover 40 from the main cover 20.

In the manner, the cross-sectional shapes of the engagement shafts 50A and 50B are set so that when the engagement shafts 50A and 50B are engaged with the corresponding groove formation portions including the upper ends of the guide ribs 46A and 46B and the steps 48A and 48B, the engagement amount increases as the open amount (open angle) of the opening 21 increases.

The surface of each stopper 53 is flush with the third wall 41*c*. When the sub-cover 40 is closed, the surface of each stopper 53 is flush with the surface of the upper rear surface wall 25D.

FIGS. 6 and 8 each show the second insertion groove 49B and the second engagement shaft 50B. However, it should be understood that the first insertion groove 49A and the first engagement shaft 50A have the same structure.

Further, as shown in FIG. 3, when the sub-cover 40 closes the opening 21 of the main cover 20, the height of each of the engagement shafts 50A and 50B from the upper surface of the first wall 41*a* is set so that each of the engagement shafts 50A and 50B is upwardly separated from the upper end of the corresponding one of the guide ribs 46A and 46B.

As shown in FIG. 1, the present embodiment includes a U-shaped recess 55 located in the front edge of the first wall 41*a* of the sub-cover 40. A stay 102 of a rearview mirror coupled to the windshield glass (not shown) is inserted through the recess 55.

Operation of Embodiment

The procedures for coupling the sub-cover 40 of the present embodiment to the main cover 20 will now be described. The main cover 20 is coupled to the windshield glass (not shown) to cover the electronic device (not shown) fixed to the windshield glass. Further, the stay of the rearview mirror (not shown) is coupled to the windshield glass through the opening 21.

The portions P1 and P2 of the sub-cover 40 held by the worker is encircled by the broken lines in FIG. 7. The portions P1 and P2 are located at the left and right ends of the sub-cover 40 in the lateral direction of the vehicle, respectively.

The first engagement shaft 50A located at the left side of the sub-cover 40 in the lateral direction of the vehicle and the second engagement shaft 50B located at the right side of the sub-cover 40 in the lateral direction of the vehicle undergo a coupling task at the same time. However, for the sake of brevity, the following description will focus on the coupling task of the second engagement shaft 50B located at the right side of the sub-cover 40 in the lateral direction of the vehicle.

Thus, except when the first engagement shaft 50A is described, it should be understood that the second engagement shaft 50B, the second cutout surface 52B, the second guide rib 46B, the second step 48B, and the second insertion groove 49B may also be respectively read as the first engagement shaft 50A, the first cutout surface 52A, the first guide rib 46A, the first step 48A, and the first insertion groove 49A. This will allow for understanding of the operation regarding the left and right sides in the lateral direction of the vehicle.

When coupling the sub-cover 40, the worker holds the portions P1 and P2 of the sub-cover 40 with one or two hands and positions the lower surface (surface) of the first wall 41*a* parallel to the lower surface (surface) of the step 25A so that the engagement shaft 50B abuts against the guide rib 46B as shown in FIGS. 4A and 4B. Then, the worker uses the guide rib 46B to guide the sub-cover 40 and upwardly move the sub-cover 40. Subsequently, the worker forces the second engagement shaft 50B against the second insertion groove 49B and inserts the second engagement shaft 50B into the second insertion groove 49B from below (refer to FIG. 5).

The pressing of the second engagement shaft 50B elastically deforms the second guide rib 46B and the second step 48B. This allows upward movement of the second engagement shaft 50B and moves the second engagement shaft 50B out of the second insertion groove 49B (refer to FIGS. 6 and 9). The second cutout surface 52B of the second engagement shaft 50B decreases the pressing force of the worker and facilitates movement of the second engagement shaft 50B out of the second insertion groove 49B. After the second engagement shaft 50B is moved out of the second insertion groove 49B, the second guide rib 46B and the second step 48B elastically return to their original positions.

Next, as shown in FIGS. 7A, 7B, and 8, the worker pivots the sub-cover 40 toward the rear of the vehicle until the second stopper 53 abuts against the second step 48B with the second engagement shaft 50B engaged with the upper end or the like of the second guide rib 46B. Instead of the worker pivoting the sub-cover 40, the weight of the sub-cover 40 may pivot the sub-cover 40 toward the rear of the vehicle until the stopper 53 abuts against the second step 48B.

The sub-cover 40, after pivoted as described above, is temporarily held on the main cover 20. The engagement amount W2 of the second engagement shaft 50B with the second guide rib 46B when the sub-cover 40 is temporarily held is larger than the engagement amount W1 of the second engagement shaft 50B with the upper end of the second guide rib 46B when the second engagement shaft 50B is moved out of the second insertion groove 49B without pivoting the sub-cover 40. This restricts separation of the sub-cover 40 from the main cover 20 when the sub-cover 40 is temporarily held.

When the sub-cover 40 is temporarily held on the main cover 20 in this manner, the front end of the sub-cover 40 is separated and released from the opening 21 as shown in FIGS. 7A, 7B, and 8. This provides space for holding the sub-cover 40 with fingers. That is, the fingers on the portions P1 and P2 in FIG. 7A do not interfere with the main cover 20, and the sub-cover 40 is temporarily held without any difficulty when held by the fingers.

FIGS. 7A and 7B do not show the stay of the rearview mirror. However, it should be understood that the stay is exposed to the outside of the cover body 10 through the recess 55 of the sub-cover 40.

Subsequently, the worker upwardly presses the lower surfaces of the first wall 41a and the like of the sub-cover 40 to close the opening 21. The pressing of the sub-cover 40 engages the first to third snap-fits 43A, 43B, and 43C respectively with the first to third fitting portions 26A, 26B, and 26C. The engaged state is maintained. As a result, the sub-cover 40 keeps the opening 21 of the main cover 20 closed (refer to FIGS. 1, 2A, 2B, and 3). In this state, as shown in FIG. 3, each of the engagement shafts 50A and 50B is upwardly separated from the upper end of each of the guide ribs 46A and 46B.

As shown in FIGS. 1 and 3, the surface of the closed sub-cover 40 is flush with the surface of the main cover 20.

The present embodiment has the advantages described below.

(1) The sub-cover temporary holding structure of the present embodiment includes the groove formation portions, which respectively define the first and second insertion grooves 49A and 49B, located in the two opposing inner sides of the opening 21 of the main cover 20. The side portions of the sub-cover 40 opposing the inner sides of the main cover 20 include the first and second engagement shafts 50A and 50B that are insertable from the outside into the first and second insertion grooves 49A and 49B and have a larger thickness than the groove width of the first and second insertion grooves 49A and 49B. The first and second engagement shafts 50A and 50B are coaxially arranged. Each groove formation portion is elastic. When each of the engagement shafts 50A and 50B is inserted from the outside, each of the groove formation portions is deformable to allow insertion of each of the engagement shafts 50A and 50B. After each of the engagement shafts 50A and 50B is inserted into the corresponding groove formation portion, each groove formation portion elastically returns to its original form. Then, the groove formation portions are engaged with the engagement shafts 50A and 50B to restrict separation of the engagement shafts 50A and 50B in the reverse direction and supports the sub-cover 40 in a manner allowing the sub-cover 40 to open while engaged with the engagement shafts 50A and 50B.

As a result, the present embodiment reduces the number of components in the sub-cover temporary holding structure and eliminates the need for a tightening tool for the sub-cover. The space for the fingers of the worker used to temporarily hold the sub-cover on the main cover is ensured without any difficulty. Because the sub-cover is temporarily held on the main cover, further space for temporarily holding the sub-cover is not required.

(2) In the sub-cover temporary holding structure of the present embodiment, the sub-cover 40 includes the surface that is flush with the surface of the main cover 20 when the opening 21 is closed. As a result, advantage (1), in particular, is easily obtained in the cover body having the sub-cover 40 that is flush with the main cover 20 when the sub-cover 40 has been coupled.

(3) In the sub-cover temporary holding structure of the present embodiment, the cross-sectional shapes of the engagement shafts 50A and 50B are set so that the engagement amount in a state in which the engagement shafts 50A and 50B are engaged with the groove formation portions is larger when the open amount (open angle) of the opening 21 is large than when the open amount is small.

As a result, the present embodiment limits separation of the sub-cover 40 from the main cover 20 when the pivoted sub-cover 40 is temporarily held.

(4) The groove formation portions of the present embodiment include the guide ribs 46A and 46B (guides) that guide the engagement shafts 50A and 50B toward the insertion grooves 49A and 49B, respectively. As a result, when the engagement shafts 50A and 50B of the sub-cover 40 are inserted from the outside into the insertion grooves 49A and 49B of the main cover 20, the engagement shafts 50A and 50B are guided by the guide ribs 46A and 46B and inserted into the insertion grooves. This facilitates the temporary holding task.

(5) In the sub-cover temporary holding structure of the present embodiment, the sub-cover 40 includes the stoppers 53 that restrict increases in the open amount of the opening 21 when engaged with the groove formation portions. This restricts the open amount of the sub-cover 40 and limits the amount of space occupied by the sub-cover 40 when temporarily held.

The above embodiment may be modified as follows.

In the embodiment, the opening 21 is U-shaped. However, the opening 21 does not need to be U-shaped and may be, for example, circular or oval.

Instead of the snap-fits 43A, 43B, and 43C and the engagement holes 21h of the embodiment, fitting projections that differ from the snap-fits in shape and structure may be arranged on one of the main cover 20 and the sub-cover 40, and fitting holes may be arranged in the other one of the main cover 20 and the sub-cover 40. In this case, the fitting projections may be press-fitted to the fitting holes.

The embodiment uses the cutout surfaces 52A and 52B. However, the cutout surfaces 52A and 52B may be omitted, and each of the engagement shafts 50A and 50B may entirely form a tubular shaft, a cylindrical shaft, or a square pillar shaft, or have an oval cross section.

In the embodiment, the main cover 20 includes the step 25A. However, the step 25A may be omitted. Instead, the entire main cover 20 may be polygonal, for example, box-shaped or cylindrical, and include an opening. In this case, the sub-cover is shaped in accordance with the shape of the opening of the main cover 20 to be flush with the surface of the main cover.

In the embodiment, the main cover 20 is coupled to the windshield glass. However, the main cover 20 does not need to be coupled to the windshield glass and may be coupled to other portions.

The embodiment includes the guide ribs 46A and 46B. However, the guide ribs 46A and 46B may be omitted. That is, the guide function may be omitted.

In the embodiment, the sub-cover 40 includes the recess 55. However, the recess 55 may be omitted when the stay of the rearview mirror does not need to be exposed to the outside of the cover body 10.

The circumferential surface of each of the engagement shafts 50A and 50B may include a protrusion that further increases the engagement amount.

In the embodiment, the main cover 20 is flush with the sub-cover 40. However, the main cover 20 does not necessarily have to be flush with the sub-cover 40. For example, the sub-cover 40 may be recessed in the opening 21.

Alternatively, the sub-cover 40 may project from the main cover 20 when closing the opening 21.

DESCRIPTION OF REFERENCE CHARACTERS

10 . . . Cover body, 20 . . . Main cover, 22 . . . Bottom wall, 23 . . . Left side wall, 24 . . . Right side wall, 25 . . . Rear side wall, 25A . . . Step, 25B . . . Curved portion, 25C . . . Lower rear surface wall, 25D . . . Upper rear surface wall, 26A, 26B, 26C . . . Fitting portions (first engagement portions), 40 . . . Sub-cover, 41*a* . . . First wall, 41*b* . . . Second wall, 41*c* . . . Third wall, 43A, 43B, 43C . . . Snap-fits (second engagement portions), 46A, 46B . . . Guide ribs (guides), 48A, 48B . . . Steps, 49A, 49B . . . Insertion grooves, 52A, 52B . . . Cutout surfaces, 53 . . . Stopper, 55 . . . Recess, P1, P2 . . . Held portions

The invention claimed is:

1. A temporary holding structure for a sub-cover on a cover body, wherein the cover body includes a main cover, which includes an opening and a first engagement portion located on a rim of the opening, and the sub-cover, which includes a second engagement portion engaged with the first engagement portion when the sub-cover closes the opening to keep the opening closed, the temporary holding structure comprising:
 a groove formation portion that defines an insertion groove, wherein the groove formation portion is located in each of two opposing inner sides of the opening; and
 two coaxially arranged engagement shafts respectively located at upper sides of two side portions of the sub-cover that oppose the two inner sides, wherein the engagement shafts are insertable into the insertion grooves from an outer lower side and have a thickness that is larger than a groove width of the insertion grooves, wherein
  the groove formation portions are elastic and deformable to allow insertion of the engagement shafts when the engagement shafts are inserted from the outer lower side, the groove formation portions elastically return to their original forms after insertion of the engagement shafts to engage the engagement shafts and restrict separation of the engagement shafts in a reverse direction, and the groove formation portions pivotally support the sub-cover to allow the sub-cover to open while engaged with the engagement shafts, and
 the main cover covers from below an electronic device fixed to a windshield glass.

2. The temporary holding structure according to claim 1, wherein the sub-cover includes a recess that exposes a stay of a rearview mirror to an outside of the cover body.

3. The temporary holding structure according to claim 1, wherein the engagement shafts each include a cutout surface that facilitates upward movement of the engagement shaft out of the corresponding insertion groove.

4. The temporary holding structure according to claim 1, wherein the sub-cover includes a surface that is flush with a surface of the main cover when closing the opening.

5. The temporary holding structure according to claim 1, wherein the engagement shafts each have a cross-sectional shape that is set so that an engagement amount of the engagement shah in a state in which the engagement shaft is engaged with the corresponding groove formation portion is larger when an open amount of the opening is large than when the open amount is small.

6. The temporary holding structure according to claim 1, wherein the groove formation portions each include a guide that guides the corresponding engagement shaft toward the corresponding insertion groove when the engagement shaft is inserted into the insertion groove from the outside.

7. The temporary holding structure according to claim 1, wherein the sub-cover includes a stopper that restricts increases in an open amount of the opening when the engagement shafts are engaged with the groove formation portions.

\* \* \* \* \*

UNITED STATES PATENT AND TRADEMARK OFFICE
CERTIFICATE OF CORRECTION

PATENT NO.        : 10,232,803 B2
APPLICATION NO.   : 15/513432
DATED             : March 19, 2019
INVENTOR(S)       : Hiroaki Ichihara et al.

Page 1 of 1

It is certified that error appears in the above-identified patent and that said Letters Patent is hereby corrected as shown below:

In the Claims

Column 12 Claim 5, Line 25, "engagement shah in a state in which the engagement shaft is..." should be --engagement shaft in a state in which the engagement shaft is...--.

Signed and Sealed this
Thirtieth Day of April, 2019

Andrei Iancu
*Director of the United States Patent and Trademark Office*